United States Patent [19]

Sanders

[11] 3,779,841

[45] Dec. 18, 1973

[54] FABRICATION OF THIN FILM RESISTOR CROSSOVERS FOR INTEGRATED CIRCUITS

[75] Inventor: Thomas J. Sanders, Indialantic, Fla.

[73] Assignee: Harris-Intertype Corporation, Cleveland, Ohio

[22] Filed: July 21, 1972

[21] Appl. No.: 273,939

[52] U.S. Cl. .......................... 156/8, 156/11, 156/17
[51] Int. Cl. .......................... B29c 17/08, C23f 1/02
[58] Field of Search ........................ 156/11, 3, 8, 17; 96/36.2; 29/576; 317/234, 235; 338/308; 117/212

[56] References Cited

UNITED STATES PATENTS

| | | | |
|---|---|---|---|
| 2,966,647 | 12/1960 | Lentz | 338/32 |
| 3,672,985 | 6/1972 | Nathanson et al. | 117/212 |
| 3,700,510 | 10/1972 | Keene et al. | 156/11 |

*Primary Examiner*—William A. Powell
*Attorney*—Donald R. Greene

[57] ABSTRACT

Thin film resistors with metal connector crossovers are fabricated on smooth nonconducting materials. The thin film resistor crossover regions are delineated by a photo-resist emulsion. After deposition of an insulator, the photo-resist material is chemically removed, leaving insulating material only in the crossover regions. Metal connectors and interconnectors are applied and delineated to the resistor and over the insulator respectively.

6 Claims, 3 Drawing Figures

PATENTED DEC 18 1973

3,779,841

FABRICATION OF THIN FILM RESISTOR CROSSOVERS FOR INTEGRATED CIRCUITS

BACKGROUND OF THE INVENTION

The invention relates generally to the field of microelectronics, and more particularly to a method for fabricating improved crossovers for thin film resistors.

DESCRIPTION OF THE PRIOR ART

It is often desirable in integrated circuit design to use thin film resistors. However, the use of these resistors makes the chip layout quite difficult because metal interconnector lines cannot cross over them, since they are located on the surface of the substrate, without making an unwated connection to the resistor. Diffused resistors do not have this problem since they lie below the insulating surface of a multilevel system. Multilevel interconnect systems can solve this problem on large complicated circuits including thin film resistors; however, on medium and small circuits the extra area needed for the first to second level metal feedthroughs and the extra processing needed makes multilevel interconnect impractical in many cases. The process of the present invention allows metal interconnect lines to crossover thin film resistors and does not have many of the disadvantages associated with multilevel interconnect.

Crossover techniques of the prior art have included point-to-point wiring and interlayer connections. Point-to-point wiring not only requires twice the time in manufacturing, but the possibility of technician error is great. Multi-layers of conduction patterns, each layer being insulated from the adjacent layer by an intervening dielectric layers, are commonly used in the interconnection of regions of a semiconductor chip. Such multilayer structures have had low yield due to the breaking of the conductors or due to the inadvertent shorting of one conductive layer to another conductive layer through pinholes or cracks in the intermediate dielectric.

A major problem in the area is the cheap and effective production of a thin filmed circuit element with effective insulating barriers at crossover points. The insulator must be thick enough to isolate the crossing element from the thin filmed element and not be so thick as to cause irregularities in the conductor so as to make it susceptible to breaking.

SUMMARY OF THE INVENTION

The present invention overcomes the problems of the multilayer prior art devices in presenting thin filmed elements with insulating crossovers which are not susceptible to cracking. According to the present invention, crossovers are accomplished by depositing an insulator on the thin filmed resistor at the point of crossover. The crossing conductor is deposited over the insulator.

The entire process is accomplished on a smooth, nonconductive material as a base substrate. A thin film resistive material is applied and delineated by a direct or reverse etching technique. The next step is to apply a dielectric material which covers all of the resistor except the very ends where contact is made with metal connectors. Metal interconnectors can now cross over the resistor and not make contact with it except as connectors at the very ends. The metal interconnectors and the metal connectors are then deposited and delineated to complete the structure.

The dielectric between the thin film resistor and the interconnectors must be pinhole-free and have a breakdown voltage larger than the highest voltage applied to the circuit. The dielectric must also be thin enough so that the metal interconnectors can crossover it without causing discontinuities. The process described allows interconnectors to cross over thin film resistors and does not have many of the disadvantages associated with the multilevel interconnects of the prior art.

OBJECTS OF THE INVENTION

An object of the present invention is to provide a simple highly reliable method of fabricating crossovers for microelectronic circuits.

It is another object of the present invention to provide a low cost crossover useful in integrated circuitry in which there is substantial reduction of fabrication steps and time.

it is a further object of the invention to provide a reliable circuit crossover of thin film elements like thin film resistors.

Other objects, advantages, and novel features of the present invention will become apparent from the following detailed description of the invention when considered in conjunction with the accompanying drawings.

DESCRIPTION OF PREFERRED EMBODIMENT

Figure 1:
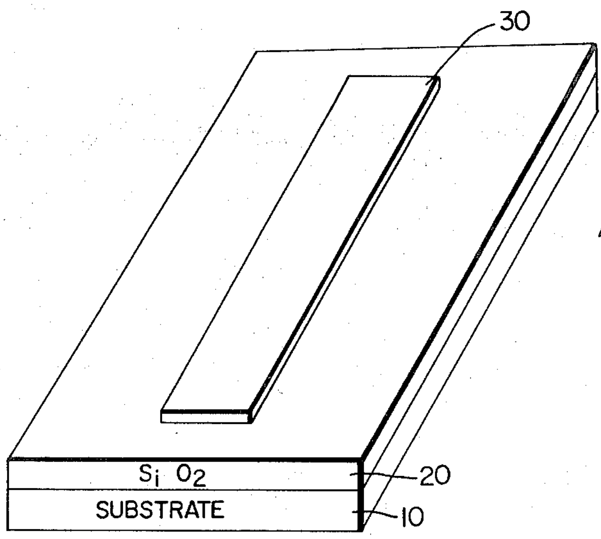
FIGS. 1–3 are perspective views of the successive stages of development in the fabrication of thin filmed resistors with insulated metal crossovers.

Referring to FIG. 1, a thin film resistor 30 is shown laminated to a smooth, nonconducting material 20 and substrate 10. The original substrate 10 is coated with a nonconductive material 20 such as $SiO_2$, but any relatively smooth nonconductive material will work for this purpose. The $SiO_2$ can be formed on a silicon substrate by oxidizing the silicon in a steam ambient at 1,100° C. for about 1 hour. Alternative nonconductive materials can include glass and glazed or unglazed ceramic.

After insulating the substrate 10 with material 20, the fabrication of a thin film resistor is commenced. Preferably a nickel-chromium resistor 30 is deposited by vacuum evaporation to form a thin film. Alternatively, the thin film resistor may be formed by vapor plating tin oxide, by sputtering tantalum or vacuum evaporating aluminum or chromium. Film thickness in the range of 200–300 angstroms are typical. The final form of resistor 30 as shown in FIG. 1 can be obtained by delinearization using direct or reverse etching of a photo-resist material. A layer of photo-resist is uniformly applied, developed to the desired pattern and chemically etched to remove unwanted resistive material. Alternate methods of forming the thin film resistor 30 are deposition using silk screen and evaporation through a mask. Other examples of resistor materials are $CrSi_2$ and $MoSi_2$, which are also deposited by vacuum evaporation.

The next step is to define the areas of the resistor which are to be insulated from the metal interconnectors. Preferably this is achieved by the application of a photo-resist emulsion and its delineation. A positive photo-resist such as Shipley can be used and has provided excellent results with glass substrates. The photo-resist may be applied by brushing, dipping, spraying, spinning or other coating techniques. Once applied, the photo-resist is exposed using a mask and developed such as to define the areas to be insulated, which include the center of the resistor and a small adjoining part of the substrate. Thus the whole substrate, including the ends of the resistor, are covered by the photo-resist material at this point in the process with a pattern defined thereon. A negative photo-resist can also be used.

Next a suitable insulating material is deposited over the entire structure at a temperature low enough so that the chemical properties of the photo-resist material are not appreciably disturbed. This process step is preferably carried out at 100° C., but other temperatures below 200° C. have been found to be satisfactory. The insulator chosen for this application is SiO, but other insulating materials such as MgO, BeO, $Al_2O_3$, $TiO_2$, $SiO_2$ and $Si_3N_4$ can be used. SiO is generally deposited by vacuum evaporation. The other insulators may be deposited by electron beam vacuum evaporation, sputtering, or by a spin-on emulsion technique. After the insulator deposition, the photo-resist emulsion is chemically removed from the substrate, taking with it the overlaying insulating material, and leaving an insulator on the substrate and resistor whose pattern corresponds to the pattern defined by the selective exposure of the photo-resist. In the case of Shipley photo-resist, acetone is used to chemically remove the material.

Figure 2:
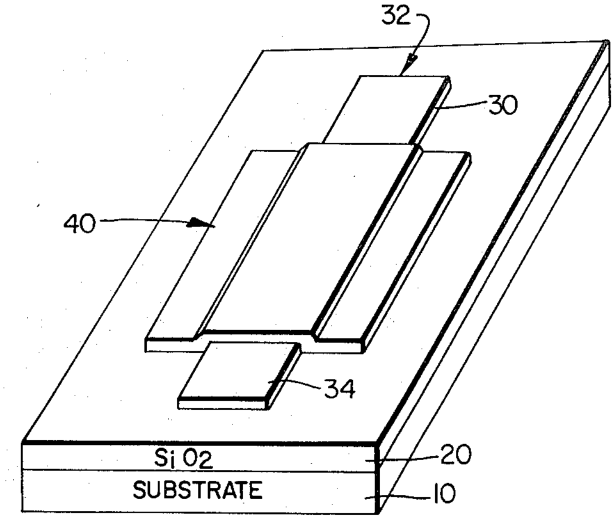

Thus the configuration of FIG. 2 results with insulator 40 overlapping resistor 32 at the crossover points and leaving exposed ends 34 and 32 to which metal connectors will later be connected. The thickness of this insulator 40 need only be a few thousand angstroms so that the metal interconnectors which will cross over the resistor and the insulator can easily cross over the structure without breaking at the edges of the insulator. However, it must be thick enough so that good isolation is achieved between the resistor and the metal interconnectors crossing over it. The insulator must be pinhole-free and have a breakdown voltage larger than the highest voltage applied to the circuit.

Figure 3:
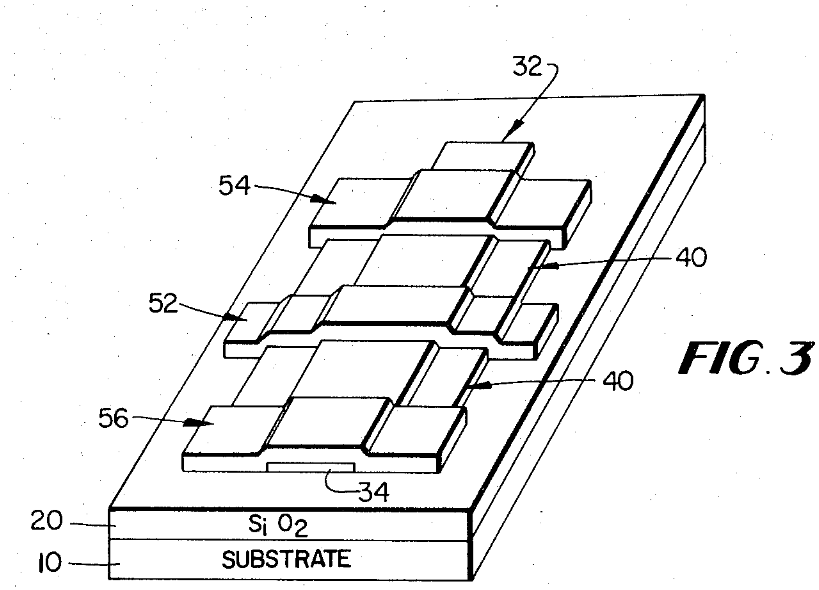

In the final step, the interconnector and connector metals are deposited and delineated by conventional means, such as silk screening, physical masking, direct photo-resist or inverse photo-resist, resulting in the structure of FIG. 3. The metal crossing over the resistor at the insulator 40 are the metal interconnectors 52. Metal connectors connecting the ends 32 and 34 of the resistor to the appropriate points in the circuitry are connectors 54 and 56, respectively. The only restriction on the interconnectors and connectors process is that it be compatible with the resistive material and the insulator material used and that the interconnectors and connectors have sufficient adherence to the other materials used.

Typically, aluminum of approximately 10,000 angstroms is applied, but other conductive metals such as molymanganese-gold combinations may be used. Aluminum is probably the most satisfactory contact metal for nickel-chromium resistors because the contact exhibits ohmic behavior and adheres satisfactorily to the resistor. Preferably, a direct photo-resist technique is used to apply and delineate the aluminum connectors and interconnectors. Aluminum is deposted over the entire substrate, followed by a coat of photo-resist. The photo-resist is exposed through a mask and etched to achieve the desired pattern for the connectors and interconnectors as shown in FIG. 3.

The crossovers produced by the present method have been evaluated to determine their effect on use in a high frequency, high impedance circuit. A typical thin film resistor achieved were linear and exactly 200 ohms-square, which was the design value. The breakdown voltage was approximately 200 volts. The above process produces thin film resistors with insulated metal interconnect crossovers without the use of multilayer interconnecting systems and without the associate disadvantages. The method of fabrication is efficient, simple and economical and produces a product of high reliability.

Although the invention has been described and illustrated in detail, it is to be clearly understood that the same is by way of illustration and example only and is not to be taken by way of limitation, the spirit and scope of this invention being limited only by the terms of the appended claims.

What is claimed:

1. A method of fabricating metal connectors for and metal interconnectors crossing over a thin film resistor for integrated circuits on a substrate which comprises the steps of:

a. applying a photoresist emulsion;
b. exposing and developing said photoresist emulsion to delineate a crossover region of said thin film resistor and said substrate from the non-crossover region;
c. depositing an insulating material on said substrate;
d. removing said insulating material from said undelineated region; and
e. applying and delineating a layer of metal to form connectors on the end of said resistor and metal interconnectors on the insulated crossover region of said resistor.

2. A method as in claim 1 wherein the step of removing said insulating material is accomplished by chemically removing said photoresist emulsion and the overlying insulating material.

3. A method as in claim 1 wherein said insulating material is silicone dioxide deposited to a thickness of a few thousand angstroms, and said layer of metal is aluminum.

4. A method as in claim 1 wherein the step of exposing and developing said emulsion delineates a crossover which covers all of said thin film resistor except the ends where contact is to be made with said metal connectors.

5. A method as in claim 1 wherein the step of depositing an insulating material is carried out at a temperature below 200° C. so that the photoresist emulsion is not appreciably disturbed chemically.

6. A method as in claim 5 wherein the step of depositing an insulating material is carried out at a temperature of below 100° C.

* * * * *